United States Patent
Roy et al.

(10) Patent No.: US 9,098,648 B2
(45) Date of Patent: Aug. 4, 2015

(54) NUMERICAL MODELING OF LINEWELD CONNECTIONS

(75) Inventors: Ritwick Roy, North Attleboro, MA (US); Juan Antonio Hurtado Ortiz, Providence, RI (US); Victor George Oancea, East Greenwich, RI (US); Manoj Kumar Mohanram Chinnakonda, Waltham, MA (US); Martin Tage Roswall, Gothenburg (SE)

(73) Assignee: Dassault Systemes Simulia Corp., Providence, RI (US)

( * ) Notice: Subject to any disclaimer, the term of this patent is extended or adjusted under 35 U.S.C. 154(b) by 362 days.

(21) Appl. No.: 13/487,900

(22) Filed: Jun. 4, 2012

(65) Prior Publication Data
US 2013/0325409 A1 Dec. 5, 2013

(51) Int. Cl.
*G06F 17/50* (2006.01)

(52) U.S. Cl.
CPC . *G06F 17/50* (2013.01); *Y02T 10/82* (2013.01)

(58) Field of Classification Search
CPC . G06F 17/50; G06F 17/5004; G06F 17/5018; Y02T 10/82
USPC ...................................... 703/1, 2, 6
See application file for complete search history.

(56) References Cited

U.S. PATENT DOCUMENTS

| | | | |
|---|---|---|---|
| 4,395,911 A | 8/1983 | Macecek | |
| 6,186,011 B1 | 2/2001 | Wung et al. | |
| 6,208,146 B1 | 3/2001 | Huang et al. | |
| 6,822,195 B2 | 11/2004 | Kanodia et al. | |
| 7,465,416 B2 * | 12/2008 | Nagaoka et al. | 264/40.1 |
| 7,658,697 B1 * | 2/2010 | Hsiang | 482/27 |
| 2003/0208985 A1 * | 11/2003 | Allen et al. | 52/653.1 |
| 2007/0090165 A1 * | 4/2007 | Kumagai | 228/101 |
| 2010/0045066 A1 * | 2/2010 | Gress et al. | 296/146.5 |
| 2011/0183304 A1 | 7/2011 | Wallace et al. | |
| 2011/0213594 A1 * | 9/2011 | Zhang | 703/1 |

OTHER PUBLICATIONS

Chalmers (Modelling of spot welds for NVH simulations in view of refined panel meshes, (2007), 69 pages).*
Fang et al. (Weld Modling with MSC.Nastran, (2000), 14 pages).*

* cited by examiner

*Primary Examiner* — Dwin M Craig
*Assistant Examiner* — Andre Pierre Louis
(74) *Attorney, Agent, or Firm* — Hamilton, Brook, Smith & Reynolds, P.C.

(57) ABSTRACT

A computer-implemented method for modeling a lineweld connecting two modeled parts includes receiving lineweld properties from a user, wherein the properties include a lineweld path. The computer-implemented method also includes positioning a plurality of fastener definitions at discrete points along the lineweld path, defining beam element definitions between adjacent fastener definitions, and analyzing the lineweld based on the fastener definitions and beam element definitions.

20 Claims, 7 Drawing Sheets

NUMERICAL MODELING OF LINEWELD CONNECTIONS

BACKGROUND OF THE INVENTION

The embodiments described herein relate generally to numerical simulation and, more particularly, to modeling lineweld connections between parts.

Linewelds are commonly used to connect several parts, including plates of various thicknesses. At least some known processes use detailed finite element modeling of the lineweld beads and the plates being welded together. However, this approach can be difficult to calibrate against experimental results for arbitrary deformation modes. Moreover, it is very costly from a computational perspective and may not accurately predict the observed lineweld failure behaviors. Another known process merely connects the two plates using a numerical "gluing" technique. Although this process may be more robust, simple to model, and computationally more efficient, its calibration is difficult and may lead to unreliable results in predicting lineweld failure.

As such, known processes lack the necessary sophistication required to accurately capture intricate deformation patterns. Moreover, known processes are difficult to calibrate to match experimental results. Furthermore, known processes are inefficient and require large amounts of processing time and power and, even then, are unreliable in predicting realistic simulation results.

BRIEF DESCRIPTION OF THE INVENTION

In one aspect, a computer-implemented method is provided for modeling a lineweld connecting two modeled parts. The computer-implemented method includes receiving lineweld properties from a user, wherein the properties include a lineweld path. The computer-implemented method also includes positioning a plurality of fastener definitions at discrete points along the lineweld path, defining beam element definitions between adjacent fastener definitions, and analyzing the lineweld based on the fastener definitions and beam element definitions.

In another aspect, a computer is provided for use in modeling a lineweld connecting two modeled parts. The computer includes a memory area configured to store lineweld properties including a lineweld path, and a processor coupled to the memory area. The processor is configured to position a plurality of fastener definitions at discrete points along the lineweld path, define beam element definitions between adjacent fastener definitions, and analyze the lineweld based on the fastener definitions and beam element definitions.

In another aspect, a computer program product includes one or more non-transitory computer-readable storage media having computer-executable components thereon for use in modeling a lineweld connecting two modeled parts. The computer-executable components include an input component that when executed by a processor causes the processor to receive lineweld properties from a user and store the lineweld properties in a memory area, wherein the lineweld properties include at least a lineweld path. The computer-executable components also include a fastener definition component that causes the processor to define and position a plurality of fastener definitions at discrete points along the lineweld path, a beam element definition component that causes the processor to define beam element definitions between adjacent fastener definitions, and an analysis component that causes the processor to analyze the lineweld based on the fastener definitions and beam element definitions.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

Exemplary embodiments of systems, methods, apparatus, and computer program products for use in modeling a lineweld connecting two modeled parts are described herein. The embodiments described herein facilitate enhanced efficiency and accuracy of lineweld analysis simulations. The individual features used in modeling the lineweld are highly nonlinear but computationally efficient. Moreover, the embodiments described herein facilitate enhanced modeling reliability in computer simulated lineweld deformations, strength, and failure, even for severe loading scenarios such as automotive crash applications.

Exemplary technical effects of the systems, methods, apparatus, and computer program products described herein include at least one of: (a) approximating a lineweld path by short, straight lineweld segments to provide a discretized abstract representation of the original lineweld geometry; (b) using nonlinear connector elements to model plasticity, damage, and failure effects in the lineweld; (c) using self-tuning coupling constraints to attach the connectors to the plates being welded; and (d) using nonlinear beam elements to enhance accuracy in modeling of the lineweld bending behavior.

Figure 1:
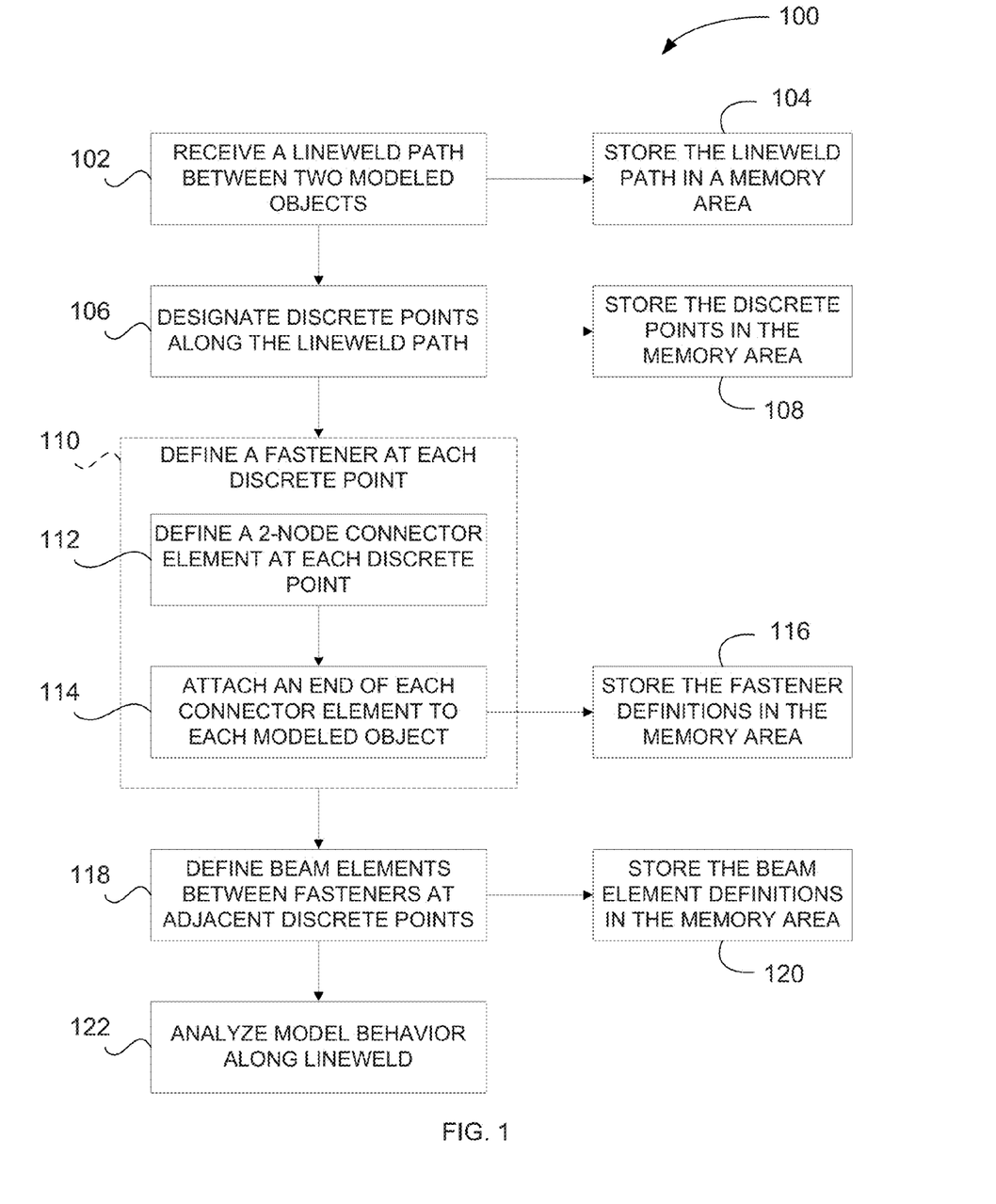
FIG. 1 is a flowchart illustrating an exemplary computer-implemented method for use in modeling a lineweld connecting two modeled parts according to the present invention.
Figure 2A:
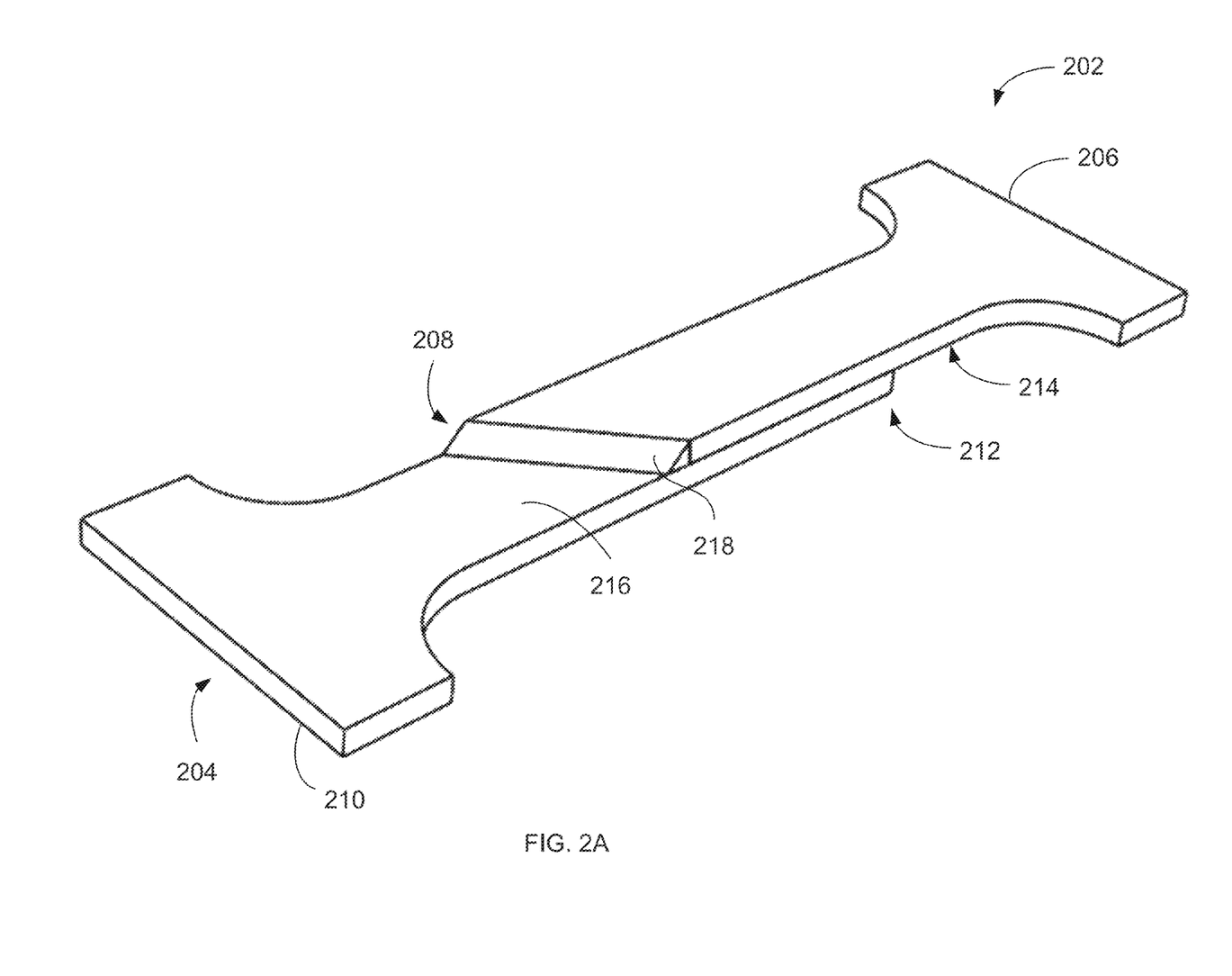
FIGS. 2A-2E are diagrams illustrating the steps of the method shown in FIG. 1.

FIG. 1 is a flowchart 100 illustrating an exemplary computer-implemented method for use in modeling a lineweld connecting two modeled parts. In an exemplary embodiment, a computer receives 102 one or more lineweld properties from a user, including, for example, a lineweld path between the two modeled parts. In an alternative embodiment, the computer automatically identifies the lineweld path by determining approximate mating point of the modeled parts. In an exemplary embodiment, the lineweld properties are stored 104 in a memory area. In some embodiments, the stored properties may be presented to a user during subsequent use to further enhance usability of the features described herein. FIG. 2A illustrates a first modeled part 202 and a second modeled part 204. The first modeled part 202 includes a first end 206 and an opposite second end 208. Similarly, the second modeled part 204 includes a first end 210 and a second end 212. As shown in FIG. 2A, the first and second modeled parts 202 and 204 are to be coupled (i.e., welded) at a desired position between the first ends 206 and 210 and the second ends 208 and 212. Moreover, the first and second modeled parts 202 and 204 are to be coupled along a portion of a bottom surface 214 of the first modeled part 202 and a portion of a top surface 216 of the second modeled part 204. The lineweld path input by the user is shown in FIG. 2A as 218.

Figure 2B:
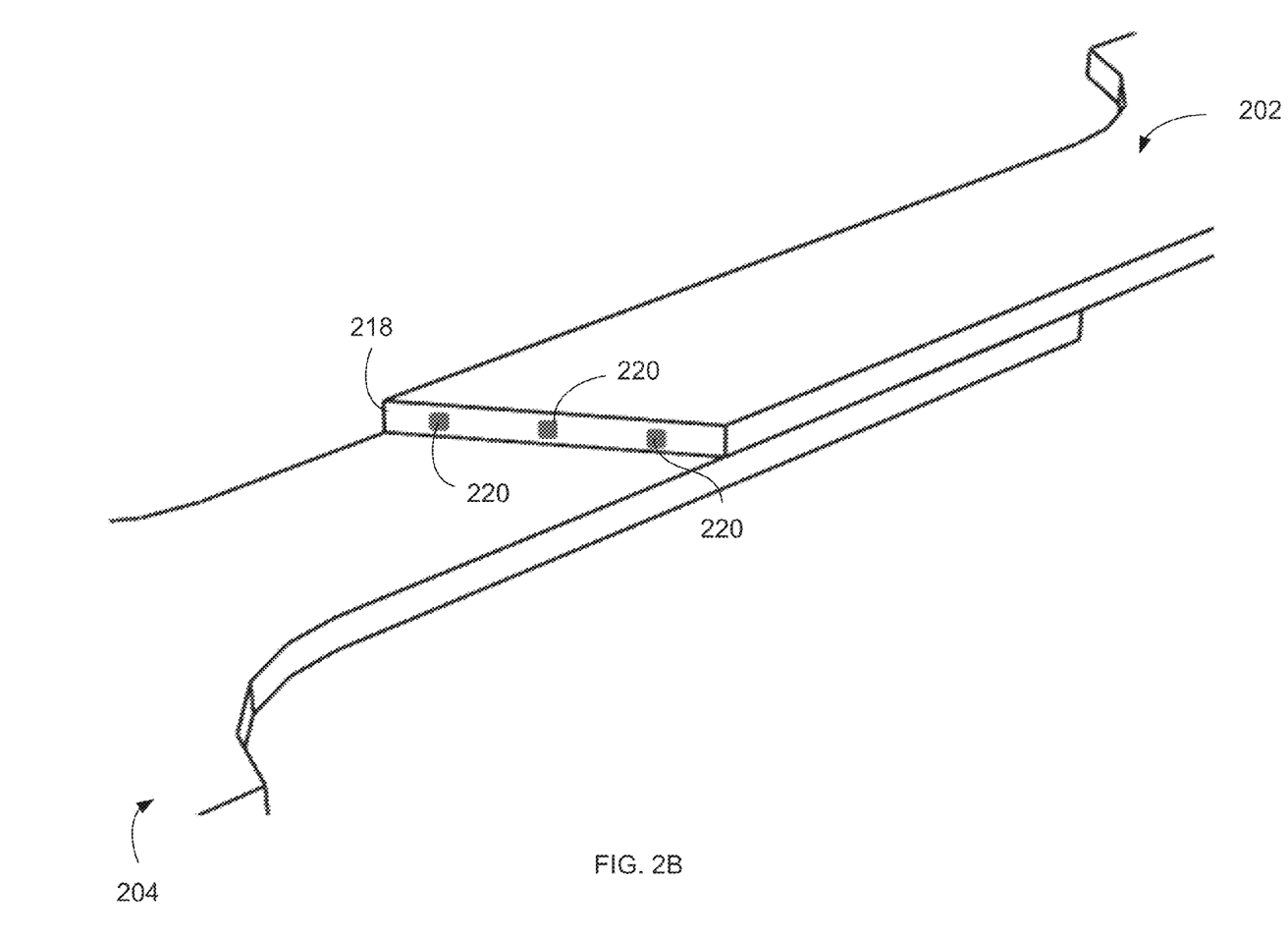

Referring again to FIG. 1, and in the exemplary embodiment, a plurality of discrete points are designated 106 along the lineweld path. In one embodiment, the user imports a file containing a list of spatial coordinates for each discrete point. In another embodiment, the discrete points are identified and input into the computer by a user via a pointing device or keyboard. In yet another embodiment, the discrete points are automatically identified by the computer. For example, the computer may define the discrete points proportionally spaced along the lineweld path. Alternatively, the computer may define the discrete points at a specified distance from each other, or may define the discrete points starting at a specified distance from the edges of the modeled parts and then at a specified distance from each other. In an exemplary embodiment, the positions (i.e., coordinates) of the discrete points are stored 108 in a memory area. FIG. 2B illustrates the plurality of discrete points 220 positioned along the lineweld path 218. Although the discrete points 220 of FIG. 2B are displayed approximately equidistant from each other, it should be noted that it is not required for the discrete points 220 to be equidistant from each other or from the edges of the first and/or second modeled parts 202 and 204.

Figure 2C:
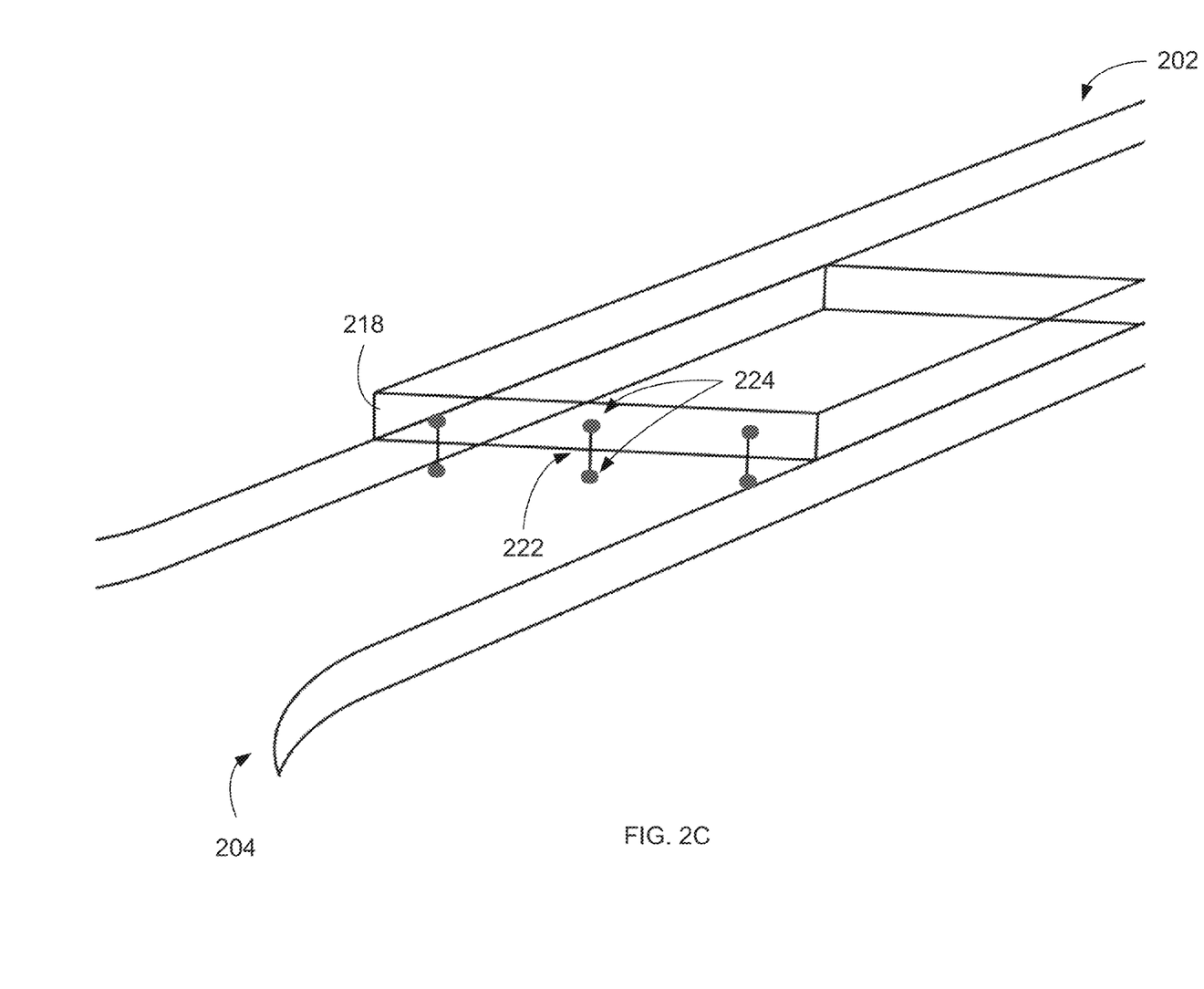

In an exemplary embodiment, each discrete point is projected on the mating parts to define 110 a fastener between the project points. More specifically, a two-node connector is defined 112 between projections of each discrete point along the lineweld path. An end of each connector element is then attached 114 to each modeled object. The fastener definitions are then stored 116 in a memory area. In an exemplary embodiment, defining properties of the fasteners is automated such that the computer automatically defines fastener projections of each discrete point. For example, the computer model will define the two-node connector element at each discrete point, project each of the two nodes to the respective surfaces of the modeled parts, and then attach the projected nodes to the respective modeled parts via distributed couplings. For modeling purposes, the connectors are highly nonlinear modeling entities that provide computational efficiency and are able to represent in a highly coupled fashion force and moment interactions in the lineweld. In an alternative embodiment, the user manually defines the fasteners as described above. FIG. 2C illustrates the fastener definitions 222 positioned at respective discrete point 220 along the lineweld path 218. FIG. 2C also illustrates the projected nodes 224 of the two-node connector element representation of the fastener.

Figures 2D, 2E:
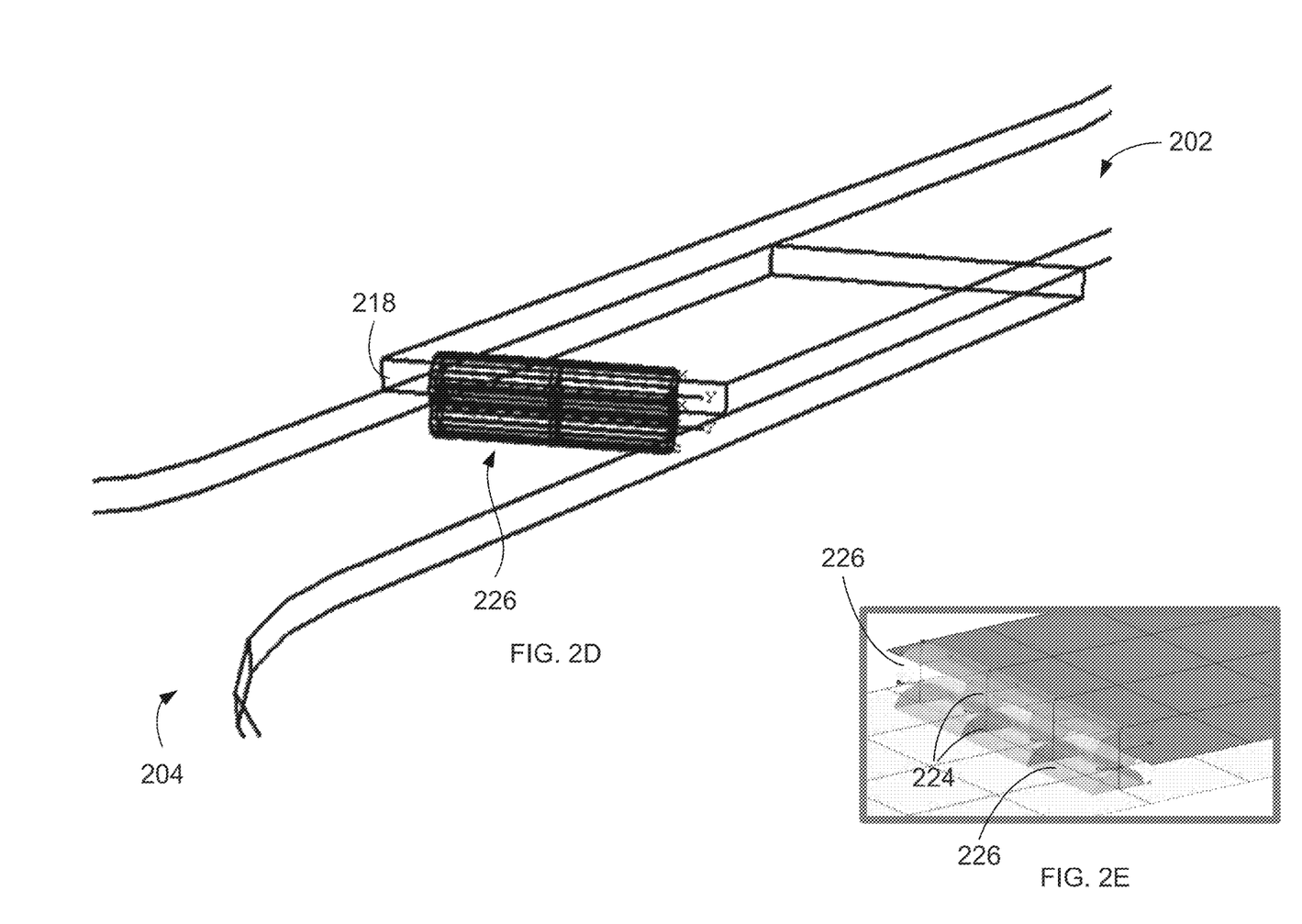

In an exemplary embodiment, a pair of beam elements is defined 118 between adjacent fastener nodes 222 along the lineweld path. The beam elements follow the lineweld path and assist with modeling the bending behavior of the lineweld itself. In one embodiment, the beam elements are automatically identified and positioned by the computer. For example, the computer may determine which fastener nodes 222 on the first and/or second modeled parts 202 and 204 are adjacent and connect these adjacent node pairs with a beam element. Alternatively, the user may define the beam elements by, for example, designating adjacent fastener nodes that are the end points of a beam element. After the beam elements are defined, they are stored 120 in a memory area. FIG. 2D illustrates the pairs of beam elements 226 defined between adjacent fastener nodes 222 along the lineweld path 218. FIG. 2E is a blown up view of the fastener nodes 222 and the beam elements 226.

In an exemplary embodiment, and after the various modeling lineweld elements are defined, the computer analyzes 122 the lineweld. For example, the computer may model and analyze the bending behavior, the peel behavior, or any other behavior of the lineweld due to outside forces imparted on the lineweld and/or the modeled objects. In some embodiments, the analysis is output to the user via a display device and/or is stored in the memory area for later retrieval.

Figure 3:
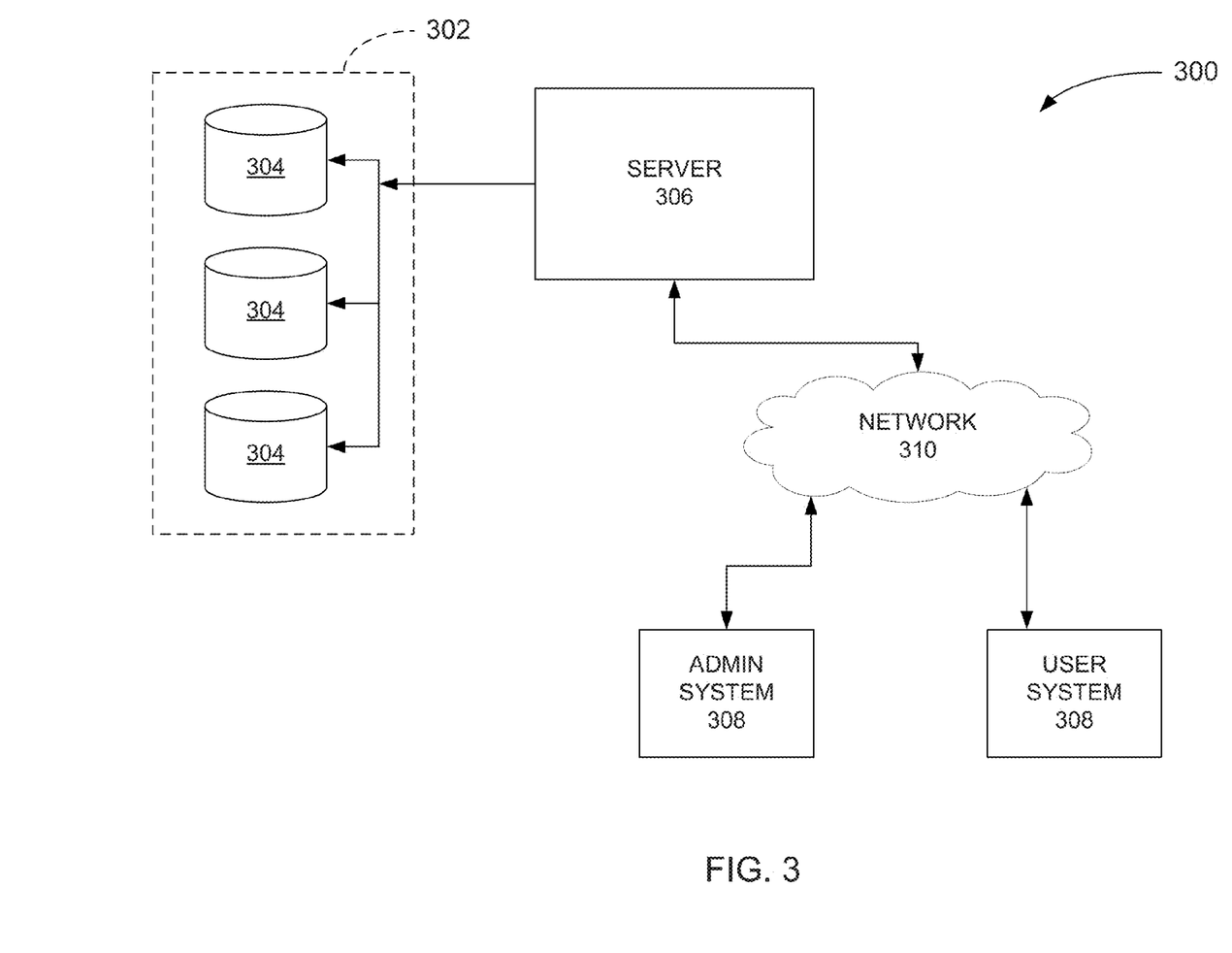
FIG. 3 is a schematic block diagram of an exemplary computer network for use in performing the embodiments described herein.

FIG. 3 is a schematic block diagram of an exemplary computer network 300 for use in modeling a lineweld connecting two modeled parts such as modeled parts 202 and 204 (shown in FIGS. 2A-2E), and/or for use in performing the processes described above and/or additional processes that may be related to those described above. In an exemplary embodiment, a memory area 302 includes one or more storage devices 304 for use in storing data, such as lineweld properties like a lineweld path, coordinates of discrete points defined along the lineweld path, fastener definitions at each discrete point, beam element definitions between fastener nodes, lineweld analysis or modeling output or results, or any other suitable data. In some embodiments, the memory area 302 is coupled to a server system 306, which is in turn coupled to client systems 308 such as an administrator system and/or a user system, via a network 310. The storage devices 304 may be embodied as one or more databases, may be located at a single or at multiple geographical sites, or may be integrated with the server system 306.

As can be appreciated, the network 310 can be a public network, such as the Internet, or a private network such as an LAN or WAN network, or any combination thereof and can also include PSTN or ISDN sub-networks. The network 310 can also be wired, such as an Ethernet network, or can be wireless such as a cellular network including EDGE, 3G, and 4G wireless cellular systems. The wireless network can also be WiFi, Bluetooth, or any other wireless form of communication that is known. Thus, the network 310 is merely exemplary and in no way limits the scope of the present advancements.

The client systems 308 can be any suitable computer architecture such as the one described below with reference to FIG. 4, or any other computing architecture that is known. Moreover, it should be understood that the server system 306 is configured to perform the processes described above and/or any additional processes that may be related to those described above.

The server system 306 stores the computer-readable instructions to execute the processes described above, and provides these instructions via the network 310 to the client systems 308. Moreover, the server system 306 can also provide data from the memory area 302 as needed to the client systems 308 such that the client systems 308 execute the processes described above. As such, FIG. 3 includes implementations of the computer system 300 via cloud computing, distributed computing, and the like.

During operation and referring to FIGS. 2A-2E and FIG. 3, the server system 306 receives from a client system 308 one or more lineweld properties as input from a user, including, for example, a lineweld path 218 between the two modeled parts such as a first modeled part 202 and a second modeled part 204. In an alternative embodiment, the server system 306 automatically identifies the lineweld path 218 by determining approximate mating points of the modeled parts 202 and 204. In an exemplary embodiment, the lineweld properties are stored in the memory area 302. A plurality of discrete points 220 are then designated along the lineweld path. In one embodiment, the user imports a file at the client system 308 containing a list of spatial coordinates for each discrete point 220, and the client system 308 transmits the coordinates to the server system 306. In yet another embodiment, the discrete points 220 are automatically identified by the server system 306. For example, the server system 306 may define the discrete points 220 proportionally spaced along the lineweld path 218. Alternatively, the server system 306 may define the discrete points 220 at a specified distance from each other, or may define the discrete points 220 starting at a specified distance from the edges of the modeled parts 202 and 204, and then at a specified distance from each other. In an exemplary embodiment, the server system 306 stores the positions (i.e., coordinates) of the discrete points in the memory area 302.

In an exemplary embodiment, the server system 306 defines a fastener 222 at each discrete point 220. More specifically, the server system 306 defines a two-node connector at each discrete point 220 along the lineweld path 218. An end of each connector element is then attached to each modeled part 202 and 204. The server system 306 then stores the fastener definitions in the memory area 302. In an exemplary embodiment, defining properties of the fasteners 222 is automated such that the server system 306 automatically defines a fastener 222 at each discrete point 220. For example, the server system 306 will define the two-node connector element at each discrete point 220, project each of the two nodes 224 to the respective surfaces of the modeled parts 202 and 204, and then attach one of the projected nodes to the respective modeled parts 202 and 204 via distributed couplings. In an alternative embodiment, the user manually defines the fasteners 222 as described above using the client system 308, and the client system 308 transmits the data to the server system 306.

In an exemplary embodiment, the server system 306 defines a pair of beam elements 226 between adjacent fastener nodes 224 along the lineweld path 218. In one embodiment, the server system 306 automatically identifies and positions the beam elements 226. For example, the server system 306 may determine which fastener nodes 224 on the first and/or second modeled parts 202 and 204 are adjacent and connect these adjacent fastener nodes 224 with a beam element 226. Alternatively, the user may define the beam elements 226 at the client system 308 by, for example, designating adjacent fastener nodes 224 that are the end points of a beam element 226, after which the client system 308 transmits the data to the server system 306. After the beam elements 226 are defined, the server system 306 stores them in the memory area 302. In an exemplary embodiment, and after the various modeling lineweld elements are defined, the server system 306 analyzes the lineweld. For example, the server system 306 may model and analyze the bending behavior, the peel behavior, or any other behavior of the lineweld due to outside forces imparted on the lineweld and/or the modeled parts 202 and 204. In some embodiments, the analysis is output to the user via a display device at the client system 308 and/or is stored in the memory area 302 for later retrieval.

Figure 4:
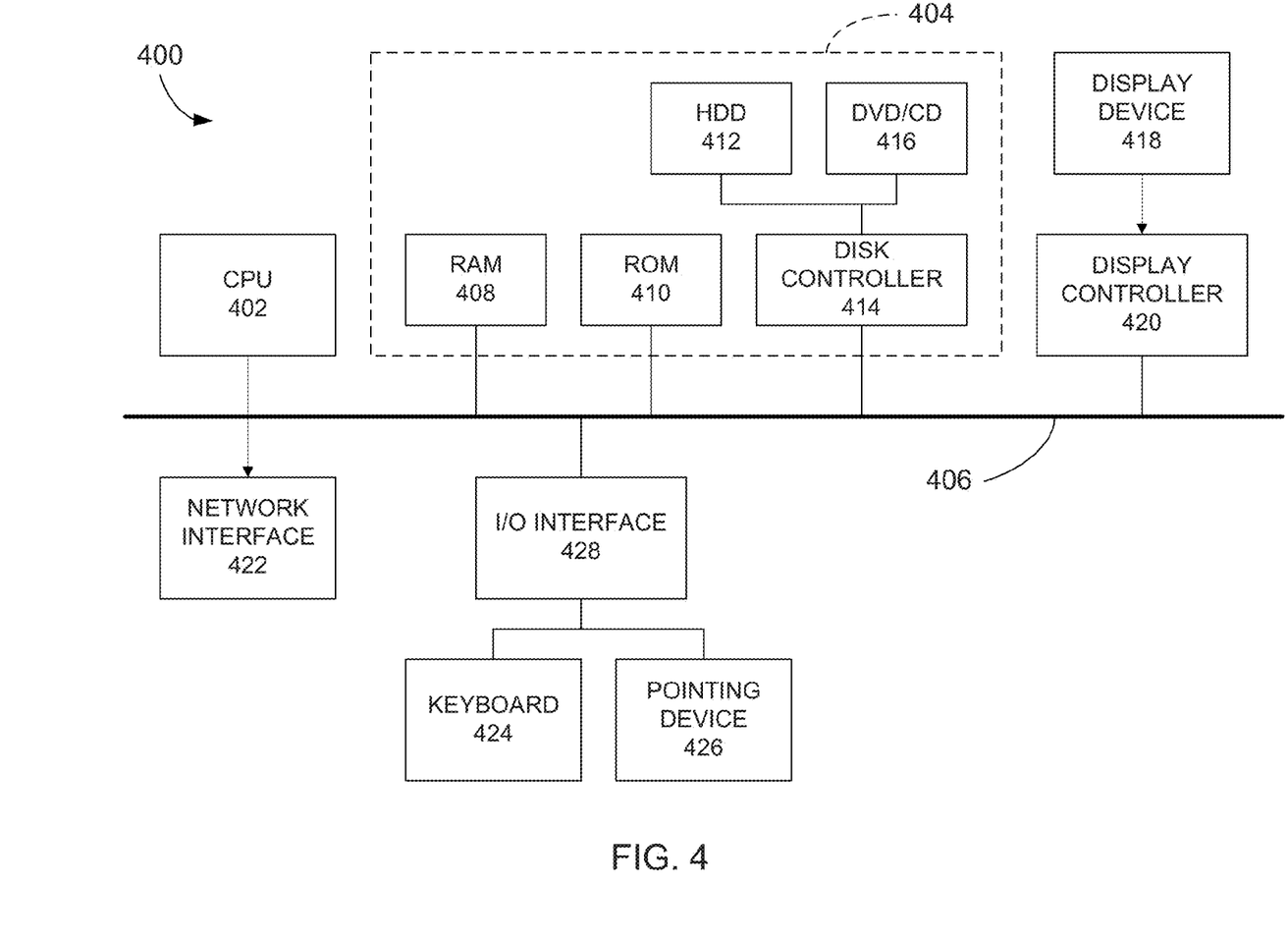
FIG. 4 is a schematic block diagram of an exemplary computer architecture for use with the computer devices shown in FIG. 3.

FIG. 4 is a schematic block diagram of an exemplary computer architecture 400 for use with the server system 306 and/or the client systems 308 (each shown in FIG. 3).

In an exemplary embodiment, the computer architecture 400 includes one or more processors 402 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 404 that is operably and/or communicatively coupled to the processor 402 by a system bus 406. A "memory area," as used herein, refers generally to any means of storing non-transitory program code and instructions executable by one or more processors to aid in modeling a lineweld connecting two modeled elements such as modeled parts 202 and 204 (shown in FIGS. 2A-2E), and/or for use in performing the processes described above and/or additional processes that may be related to those described above. The memory area 404 may include one, or more than one, forms of memory. For example, the memory area 404 may include random-access memory (RAM) 408, which can include non-volatile RAM, magnetic RAM, ferroelectric RAM, and/or other forms of RAM. The memory area 404 may also include read-only memory (ROM) 410 and/or flash memory and/or electrically-programmable read-only memory (EEPROM). Any other suitable magnetic, optical, and/or semiconductor memory, such as a hard-disk drive (HDD) 412, by itself or in combination with other forms of memory, may be included in the memory area 404. The HDD 412 may also be coupled to a disk controller 414 for use in transmitting and receiving messages to and from the processor 402. Moreover, the memory area 404 may also be, or may include, a detachable or removable memory 416, such as a suitable cartridge disk, CD-ROM, DVD, or USB memory. The above examples are exemplary only and, thus, are not intended to limit in any way the definition and/or meaning of the term "memory area."

The computer architecture 400 also includes a display device 418 that is coupled, such as operatively coupled, to a display controller 420. The display controller 420 receives data via the system bus 406 for display by the display device 418. The display device 418 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 418 may include a touchscreen with an associated touchscreen controller 420. The above examples are exemplary only and, thus, are not intended to limit in any way the definition and/or meaning of the term "display device."

In addition, the computer architecture 400 includes a network interface 422 for use in communicating with a network (not shown in FIG. 4). Moreover, the computer architecture 400 includes one or more input devices, such as a keyboard 424 and/or a pointing device 426, such as a roller ball, mouse, touchpad, and the like. The input devices are coupled to and controlled by an input/output (I/O) interface 428, which is further coupled to the system bus 406.

A description of the general features and functionality of the display device 418, keyboard 424, pointing device 426, as well as the display controller 420, disk controller 414, network interface 422, and I/O interface 428 is omitted herein for brevity as these features are known.

During operation and referring to FIGS. 2A-2E and FIG. 4, the processor 402 receives one or more lineweld properties as input from a user via the keyboard 424 and/or the pointing device 426, including, for example, a lineweld path 218 between the two modeled parts such as a first modeled part 202 and a second modeled part 204. In an alternative embodiment, the processor 402 automatically identifies the lineweld path 218 by determining an approximate mating point of the modeled parts 202 and 204. In an exemplary embodiment, the lineweld properties are stored in the memory area 404. A plurality of discrete points 220 are then designated along the lineweld path. In one embodiment, the user imports a file containing a list of spatial coordinates for each discrete point 220. In yet another embodiment, the discrete points 220 are automatically identified by the processor 402. For example, the processor 402 may define the discrete points 220 proportionally spaced along the lineweld path 218. Alternatively, the processor 402 may define the discrete points 220 at a specified distance from each other, or may define the discrete points 220 starting at a specified distance from the edges of the modeled parts 202 and 204, and then at a specified distance from each other. In an exemplary embodiment, the processor 402 stores the positions (i.e., coordinates) of the discrete points in the memory area 404.

In an exemplary embodiment, the processor 402 defines a fastener 222 at each discrete point 220. More specifically, the processor 402 defines a two-node connector at each discrete point 220 along the lineweld path 218. An end of each connector element is then attached to each modeled part 202 and 204. The processor 402 then stores the fastener definitions in the memory area 404. In an exemplary embodiment, defining properties of the fasteners 222 is automated such that the processor 402 automatically defines a fastener 222 at each discrete point 220. For example, the processor 402 will define the two-node connector element at each discrete point 220, project each of the two nodes 224 to respective surfaces of the modeled parts 202 and 204, and then attach the projected nodes 224 to the respective modeled parts 202 and 204 via distributed couplings. In an alternative embodiment, the user manually defines the fasteners 222 as described above using the keyboard 424 and/or the pointing device 426.

In an exemplary embodiment, the processor 402 defines a pair of beam elements 226 between adjacent fastener nodes 224 along the lineweld path 218. In one embodiment, the processor 402 automatically identifies and positions the beam elements 226. For example, the processor 402 may determine which fastener nodes 224 on the first and/or second modeled parts 202 and 204 are adjacent and connect these adjacent nodes with a beam element 226. Alternatively, the user may define the beam elements 226 via the keyboard 424 and/or the pointing device 426 by, for example, designating adjacent fastener nodes 224 that are the end points of a beam element 226. After the beam elements 226 are defined, the processor 402 stores them in the memory area 404. In an exemplary embodiment, and after the various modeling lineweld elements are defined, the processor 402 analyzes the lineweld. For example, the processor 402 may model and analyze the bending behavior, the peel behavior, or any other behavior of the lineweld due to outside forces imparted on the lineweld and/or the modeled parts 202 and 204. In some embodiments, the analysis is output to the user via the display device 418 and/or is stored in the memory area 404 for later retrieval.

Exemplary embodiments of systems, methods, apparatus, and computer program products for use in modeling a lineweld connecting two modeled parts are described above in detail. The systems, methods, apparatus, and computer program products are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

A computer, such as the client systems or server systems described herein, includes at least one processor or processing unit and a system memory. The computer typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

Exemplary computer-executable components include an input component that when executed by a processor, such as processor 402 (shown in FIG. 4), causes the processor to receive lineweld properties from a user and store the lineweld properties in a memory area, the lineweld properties including at least a lineweld path. The components also include a fastener definition component that causes the processor to define and position a plurality of fastener definitions at discrete points along the lineweld path, and a beam element definition component that causes the processor to define beam element definitions between adjacent fastener definitions. Moreover, the components include an analysis component that causes the processor to analyze the lineweld based on the fastener definitions and beam element definitions.

In some embodiments, the input component also causes the processor to receive, from the user, identification of the modeled parts to be connected via the lineweld. Moreover, in some embodiments, the input component causes the processor to receive, from the user, an indication of the position along the lineweld path of each of the plurality of fastener definitions. Furthermore, in some embodiments, the input component causes the processor to receive, from the user, an indication of the fastener definitions to be connected for each beam element definition.

In some embodiments, the fastener definition component also causes the processor to import into the memory area a list of spatial coordinates to indicate the positions of the fastener definitions. In some embodiments, the analysis component also causes the processor to model bending behavior of the lineweld.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method for modeling a lineweld connecting two modeled parts, said computer-implemented method comprising:
    receiving lineweld properties from a user, the properties including a lineweld path;
    positioning a plurality of fastener definitions at discrete points along a length of the lineweld path;
    for at least two modeled parts, defining a respective beam element definition for each of the at least two modeled parts, each respective beam element definition being between adjacent fastener definitions along the length of the lineweld path, said adjacent fastener definitions being on the respective modeled parts, wherein defining the respective beam elements includes identifying the fastener definitions that are adjacent and connecting the identified adjacent fastener definitions with the respective beam elements; and
    analyzing, using a processor, the lineweld based on the fastener definitions and beam element definitions, wherein analyzing the lineweld comprises analyzing bending behavior of the lineweld using the beam element definitions to improve accuracy of the bending behavior.

2. A computer-implemented method in accordance with claim 1, further comprising receiving, from the user, identification of the modeled parts to be connected via the lineweld.

3. A computer-implemented method in accordance with claim 1, wherein positioning a plurality of fastener definitions comprises receiving, from the user, an indication of the position along the lineweld path of each of the plurality of fastener definitions.

4. A computer-implemented method in accordance with claim 1, wherein positioning a plurality of fastener definitions comprises importing into a computer a list of spatial coordinates to indicate the positions of the fastener definitions.

5. A computer-implemented method in accordance with claim 1, wherein positioning a plurality of fastener definitions comprises:
    defining a two-node non-linear force-moment coupled connector element at each discrete point; and
    attaching one node of each non-linear force-moment coupled connector element to each modeled part via respective self-tuning and mesh insensitive distributed coupling constraints.

6. A computer-implemented method in accordance with claim 1, wherein defining the beam element definitions comprises receiving, from the user, an indication of the fastener definitions to be connected for the beam element definitions.

7. A computer for use in modeling a lineweld connecting two modeled parts, said computer comprising:
    a memory area configured to store lineweld properties including a lineweld path; and
    a processor coupled to said memory area, said processor configured to:
        position a plurality of fastener definitions at discrete points along a length of the lineweld path;
        for at least two modeled parts, define a respective beam element definition for each of the at least two modeled parts, each respective beam element definition being between adjacent fastener definitions along the length of the lineweld path, said adjacent fastener definitions being on the respective modeled parts, wherein defining the respective beam elements includes identifying the fastener definitions that are adjacent and connecting the identified adjacent fastener definitions with the respective beam elements; and
        analyze the lineweld based on the fastener definitions and beam element definitions, wherein analyzing the lineweld comprises analyzing bending behavior of the lineweld using the beam element definitions to improve accuracy of the bending behavior.

8. A computer in accordance with claim 7, wherein said processor is further configured to receive the lineweld properties from a user.

9. A computer in accordance with claim 7, wherein said processor is further configured to receive, from a user, identification of the modeled parts to be connected via the lineweld.

10. A computer in accordance with claim 7, wherein said processor is further configured to receive, from a user, an indication of the position along the lineweld path of each of the plurality of fastener definitions.

11. A computer in accordance with claim 7, wherein said processor is further configured to import into said memory area a list of spatial coordinates to indicate the positions of the fastener definitions.

12. A computer in accordance with claim 7, wherein said processor is further configured to:
    define a two-node non-linear force-moment coupled connector element at each discrete point; and
    attach one node of each non-linear force-moment coupled connector element to each modeled part via respective self-tuning and mesh insensitive distributed coupling constraints.

13. A computer in accordance with claim 7, wherein said processor is further configured to receive, from a user, an indication of the fastener definitions to be connected for the beam element definitions.

14. A computer in accordance with claim 7, wherein said processor is further configured to model bending behavior of the lineweld using the beam element along the length of the lineweld to improve accuracy of the bending behavior.

15. A computer program product comprising:
    one or more non-transitory computer-readable storage media having computer-executable components thereon for use in modeling a lineweld connecting two modeled parts, said computer-executable components comprising:

an input component that when executed by a processor causes the processor to receive lineweld properties from a user and store the lineweld properties in a memory area, the lineweld properties including at least a lineweld path;

a fastener definition component that when executed by a processor causes the processor to define and position a plurality of fastener definitions at discrete points along a length of the lineweld path;

a beam element definition component that when executed by a processor causes the processor to define, for at least two modeled parts, a respective beam element definition for each of the at least two modeled parts, each respective beam element definition being between adjacent fastener definitions along the length of the lineweld path, said adjacent fastener definitions being on the respective modeled parts, wherein defining the respective beam elements includes identifying the fastener definitions that are adjacent and connecting the identified adjacent fastener definitions with the respective beam elements; and an analysis component that when executed by a processor causes the processor to analyze the lineweld based on the fastener definitions and beam element definitions, wherein analyzing the lineweld comprises analyzing bending behavior of the lineweld using the beam element definitions to improve accuracy of the bending behavior.

16. A computer program product in accordance with claim 15, wherein said input component further causes the processor to receive, from the user, identification of the modeled parts to be connected via the lineweld.

17. A computer program product in accordance with claim 15, wherein said input component further causes the processor to receive, from the user, an indication of the position along the lineweld path of each of the plurality of fastener definitions.

18. A computer program product in accordance with claim 15, wherein said fastener definition component further causes the processor to import into the memory area a list of spatial coordinates to indicate the positions of the fastener definitions.

19. A computer program product in accordance with claim 15, wherein said input component further causes the processor to receive, from the user, an indication of the fastener definitions to be connected for the beam element definitions.

20. A computer product in accordance with claim 15, wherein said fastener definition component is configured to position the plurality of fastener definitions by:

defining a two-node non-linear force-moment coupled connector element at each discrete point; and attaching one node of each non-linear force-moment coupled connector element to each modeled part via respective self-tuning and mesh insensitive distributed coupling constraints.

* * * * *